United States Patent [19]
Jang

[11] Patent Number: 5,999,021
[45] Date of Patent: Dec. 7, 1999

[54] PAD SIGNAL DETECTING CIRCUIT IN A SEMICONDUCTOR DEVICE FOR DETECTING A REFERENCE VOLTAGE IN A HIGH-SPEED INTERFACE

[75] Inventor: Hyun-soon Jang, Seoul, Rep. of Korea

[73] Assignee: Samsung Electronics Co., Ltd., Kyungki-do, Rep. of Korea

[21] Appl. No.: 08/912,654

[22] Filed: Aug. 18, 1997

[30] Foreign Application Priority Data

Aug. 20, 1996 [KR] Rep. of Korea ....................... 96-34505

[51] Int. Cl.⁶ .............................. H03K 5/00; H03K 17/00
[52] U.S. Cl. .............................................. 327/97; 327/541
[58] Field of Search ............................. 327/97, 261–264, 327/276, 278, 281, 285, 288, 309, 310, 321, 328, 379, 389, 391, 394, 399, 427, 434, 437, 541, 543, 546; 326/23, 24, 27

[56] References Cited

U.S. PATENT DOCUMENTS

| 4,698,529 | 10/1987 | Asami | 327/310 |
| 5,640,118 | 6/1997 | Drouot | 327/306 |
| 5,734,292 | 3/1998 | Shirai et al. | 327/541 |

*Primary Examiner*—My-Trang Nu Ton
*Attorney, Agent, or Firm*—Skjerven, Morrill, MacPherson, Franklin & Friel LLP; David T. Millers

[57] ABSTRACT

A pad signal detecting circuit for detecting a reference voltage input to a pad of a semiconductor device. This invention may be used in high speed terminated interfaces using a reference voltage, such as those using stub series termination logic (SSTL). The invention allows the manufacture of semiconductor devices having more than one type of interface, because the device can sense the type of interface which is connected to the pad and activate the appropriate interface circuitry. This feature eliminates the need to manufacture different devices for different types of interfaces, and it facilitates high volume and low cost production of semiconductor devices that are compatible with more than one type of interface circuitry.

32 Claims, 2 Drawing Sheets

PAD SIGNAL DETECTING CIRCUIT IN A SEMICONDUCTOR DEVICE FOR DETECTING A REFERENCE VOLTAGE IN A HIGH-SPEED INTERFACE

BACKGROUND OF THE INVENTION

The present invention relates to a pad signal detecting circuit in a semiconductor device, and more particularly, to a pad signal detecting circuit for detecting a reference voltage input to a pad of a semiconductor device. This invention is particularly applicable to high speed terminated interfaces using a reference voltage, such as those using Stub Series Termination Logic (SSTL). The invention allows the manufacture of semiconductor devices having more than one type of interface, because the device can sense the type of interface which is connected to the pad and activate the appropriate interface circuitry. This feature eliminates the need to manufacture different devices for different types of interfaces, and it facilitates high volume and low cost production of semiconductor devices that are compatible with more than one type of interface circuitry.

It is well-known that the operating clock speed of the central processing unit (CPU) in computers has increased substantially. The increased CPU operating speed requires that the peripheral devices connected to the CPU, such as semiconductor memory devices and application-specific integrated circuits, must also operate at a high speed. The high-speed operating requirements are satisfied to a certain extent by semiconductor memory devices such as synchronous dynamic random access memory (SDRAM) and Ram-Bus DRAM (RDRAM).

Despite the development of high speed peripheral devices, the lack of a high speed data bus for connecting the devices with the CPU and with each other is an obstacle to the implementation of high-speed computers. In addition, the time required to transmit signals via a data bus increases with a longer bus. To overcome this problem, the Transistor Transistor Logic (TTL) level interface has been replaced by terminated interfaces which use signals referenced to a reference voltage Vref rather than to a ground voltage. There are many types of interfaces that use a reference voltage Vref, such as Stub Series Termination Logic (SSTL), Terminated Low Voltage TTL (T-LVTTL), Gunning Transceiver Logic (GTL), and High Speed Transceiver Logic (HSTL). Typical values of Vref for these interfaces are 1.5 volts, 1.5 volts, 0.8 volts, and 0.75 volts, respectively.

One type of SSTL interface has been defined by the Electronic Industries Association EIA/JEDEC standard number JESD8-8, which is incorporated by reference herein. The SSTL interface is a terminated high-speed interface, so the actual signal voltages are dependent in part on the terminated impedance of the signal lines, such as 25 ohms or 50 ohms. The SSTL signals are referenced to a voltage Vref, which is set at Vref=0.45×Vdd. Therefore, for a Vdd of 3.3 volts, Vref=0.45×3.3=1.5 volts. The SSTL "high" and "low" signals are above and below Vref, and they are specified differently for steady-state DC operation and for AC operation. DC operation requires input voltages which are Vref+200 millivolts for a high and Vref−200 millivolts for a low. AC operation requires input voltages which are Vref+400 millivolts for a high and Vref−400 millivolts for a low. For example, in a 3.3 volt system terminated at 50 ohms, Vref is 1.5 volts, a SSTL "high" input signal is 1.9 volts, and a SSTL "low" input signal is 1.1 volts.

In terminated interfaces using a reference voltage, such as SSTL, the small voltage swing about Vref facilitates implementations that run at clock speeds greater than 100 MHz. The decreased voltage swing not only facilitates higher speed, it also reduces the operating power required to drive the interface and thereby lowers the operating temperature of semiconductor devices using this type of interface.

Semiconductor devices that operate with multiple types of interfaces, including at least one of which uses a reference voltage, require a Vref detecting circuit. In this type of application, a circuit for detecting Vref applied to a pad in a semiconductor device is termed a pad signal detecting circuit.

FIGS. 1A and 1B are circuit diagrams of conventional pad signal detecting circuits in a semiconductor device. FIG. 1A illustrates a Vss detecting circuit and FIG. 1B illustrates a Vcc detecting circuit.

In FIG. 1A, a single pad 11, a PMOS transistor 13, and three inverters 15, 17, and 19 connected in series are arranged in a semiconductor device 1. The drain of the PMOS transistor 13 is connected to the pad 11, its gate is grounded, and its source is connected to a power source Vdd. The drain of the PMOS transistor 13 is also connected to the input terminal of the first inverter 15, and an output signal PDET is generated by the output terminal of the third inverter 19. PMOS transistor 13 is a long channel transistor, so it acts as a resistance element.

The circuit shown in FIG. 1A operates as follows. When a voltage of a logic high level, for example Vdd, is input to the pad 11, it is inverted three times while passing through three inverters 15, 17, and 19. Therefore, PDET is set to a logic low level, or false output state. On the other hand, if a voltage of a logic low level, for example Vss, is input to the pad 11, the input of first inverter 15 is pulled to a logic low level and PDET is set to a logic high level, or true output state. Here, the PMOS transistor 13 prevents PDET from being true (high) when the pad 11 is disconnected from a peripheral device, and thus it supplies a voltage of a logic high level to the first inverter 15 when the pad is in an open circuit state. As described above, the circuit of FIG. 1A detects an input of Vss to pad 11 so that PDET is set to a high level (true) when Vss is applied to the pad.

In FIG. 1B, the semiconductor device 1 contains the pad 11, an NMOS transistor 21, and three inverters 15, 17, and 19 connected in series. The drain of the NMOS transistor 21 is connected to the pad 11, its gate is connected to Vdd, and its source is grounded. The drain of the NMOS transistor 21 is connected to the input terminal of the first inverter 15, and an output signal PDETB is generated by the output terminal of the third inverter 19. NMOS transistor 21 is a long channel transistor, so it acts as a resistance element.

The circuit shown in FIG. 1B operates as follows. When Vdd is input to the pad 11, it is inverted three times while passing through three inverters 15, 17, and 19. Thus, PDETB is set to a logic low level, or true output state. When Vss is input to the pad 11, or pad 11 is connected to an open circuit, PDETB is set to a logic high level, or false output state. As described above, the circuit of FIG. 1B detects an input of Vdd to pad 11 so that PDETB is set to a logic low level (true) when Vdd is applied to the pad.

However, if Vref of 1.0 V, for example, is input to pad 11 in FIGS. 1A and 1B, the inverters 15, 17, and 19 malfunction. The malfunction is described below in connection with the detailed circuit diagram of an inverter shown in FIG. 2.

In FIG. 2, if a Vref of 1.0 V is input to an input terminal 23, a PMOS transistor 25 and an NMOS transistor 27 are simultaneously activated. This allows current to flow directly from Vdd to ground through the PMOS and NMOS transistors 25 and 27, thereby increasing the power dissipation of the interface circuitry. Furthermore, the voltage at an output terminal 29 is set to an intermediate level which is neither a logic high level nor a logic low level, due to the activation of both PMOS and NMOS transistors 25 and 27. As a result, the inverter does not perform the expected function of inverting the signal present at its input terminal 23.

As described above, an input of Vdd or Vss to a pad 11 can be detected in the prior art, whereas an input of Vref to the pad 11 is not properly detected. Therefore, interfaces using Vref generally cannot be connected to a semiconductor device having conventional interface circuitry. This invention allows the manufacture of semiconductor devices having more than one type of interface, because the device can sense the type of interface that is connected to the pad 11 and activate the appropriate interface circuitry. This feature eliminates the need to manufacture different devices for different types of interfaces, and it facilitates high volume and low cost production of semiconductor devices that are compatible with more than one type of interface circuitry.

SUMMARY OF THE INVENTION

An object of the present invention is to provide a pad signal detecting circuit in a semiconductor device, for detecting a reference voltage Vref.

Another object of the invention is to provide interface circuitry for a semiconductor device which will operate properly with signal levels in high-speed terminated interfaces using a reference voltage, such as SSTL, T-LVTTL, GTL, HSTL, and others.

Another object of the invention is to allow the manufacture of semiconductor devices having more than one type of interface, in which the device senses the type of interface which is connected to the pad and activates the appropriate interface circuitry.

Another object of the invention is to eliminate the need to manufacture different devices for different types of interfaces, thereby facilitating high volume and low cost production of semiconductor devices that are compatible with more than one type of interface circuitry.

To achieve these objects, there is provided a reference signal detecting circuit in a semiconductor device, comprising a first NMOS transistor having a gate coupled to a pad which receives an input signal, a source connected to ground, and a drain connected through a first resistance element to a power supply voltage; a second resistance element connected between the gate of the first NMOS transistor and ground; and a logic gate having an input connected to the drain of the first NMOS transistor and an output, wherein the logic gate generates a reference voltage detect signal when the first NMOS transistor is activated in response to the input signal having a voltage of approximately a reference voltage or greater.

In this embodiment, it is preferable that the first resistance element comprises a PMOS transistor having a drain connected to the drain of the first NMOS transistor, a gate connected to ground, and a source connected to the power supply voltage; and the second resistance element comprises a second NMOS transistor having a drain connected to the gate of the first NMOS transistor, a gate connected to the power supply voltage, and a source connected to ground. It is also preferable that the PMOS transistor and the second NMOS transistor are long channel transistors, and that the logic gate comprises a first inverter having an input connected to the drain of the first NMOS transistor, and an output connected to an input of a second inverter, wherein the second inverter has an output which generates the reference voltage detect signal. Certain applications may require only one inverter, as long as the proper signal polarity is recognized.

To achieve these objects, there is also provided a reference signal detecting circuit in a semiconductor device, comprising a first PMOS transistor having a gate coupled to a pad which receives an input signal, a source connected to a power supply voltage, and a drain connected through a first resistance element to ground; a second resistance element connected between the gate of the first PMOS transistor and the power supply voltage; and a logic gate having an input connected to the drain of the first PMOS transistor and an output, wherein the logic gate generates a reference voltage detect signal when the first PMOS transistor is activated in response to the input signal having a voltage of approximately a reference voltage or greater.

In this embodiment, it is also preferable that the first resistance element comprises an NMOS transistor having a drain connected to the drain of the first PMOS transistor, a gate connected to the power supply voltage, and a source connected to ground; and the second resistance element comprises a second PMOS transistor having a drain connected to the gate of the first PMOS transistor, a gate connected to ground, and a source connected to the power supply voltage. It is also preferable that the second PMOS transistor and the NMOS transistor are long channel transistors, and that the logic gate comprises a first inverter having an input connected to the drain of the first PMOS transistor, and an output connected to an input of a second inverter, wherein the second inverter has an output which generates the reference voltage detect signal. Certain applications may require only one inverter, as long as the proper signal polarity is recognized.

According to the present invention, Vref applied to a pad can be detected, thus enabling interfaces using Vref, such as SSTL, T-LVTTL, GTL, HSTL, and others to be connected to a semiconductor device which is also compatible with standard interfaces such as TTL.

BRIEF DESCRIPTION OF THE DRAWINGS

The above object and advantages of the present invention will become more apparent by describing in detail preferred embodiments thereof with reference to the attached drawings in which.

DETAILED DESCRIPTION OF THE INVENTION

Figure 1A:
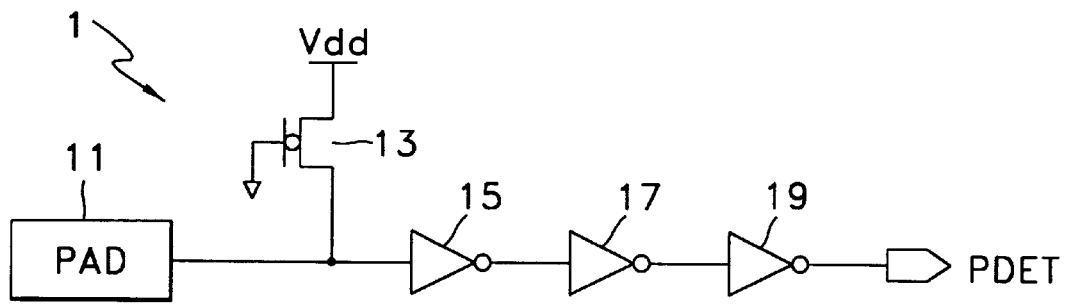
FIGS. 1A and 1B are circuit diagrams of conventional pad signal detecting circuits in a semiconductor device.
Figure 1B:
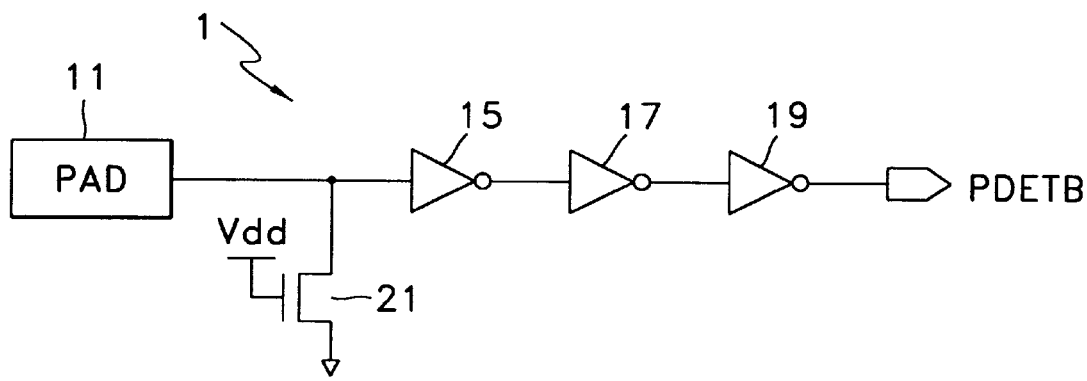
Figure 2:
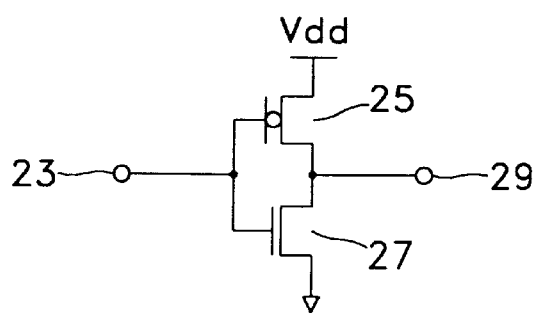
FIG. 2 is a detailed circuit diagram of the inverters shown in FIGS. 1A and 1B.
Figure 3:
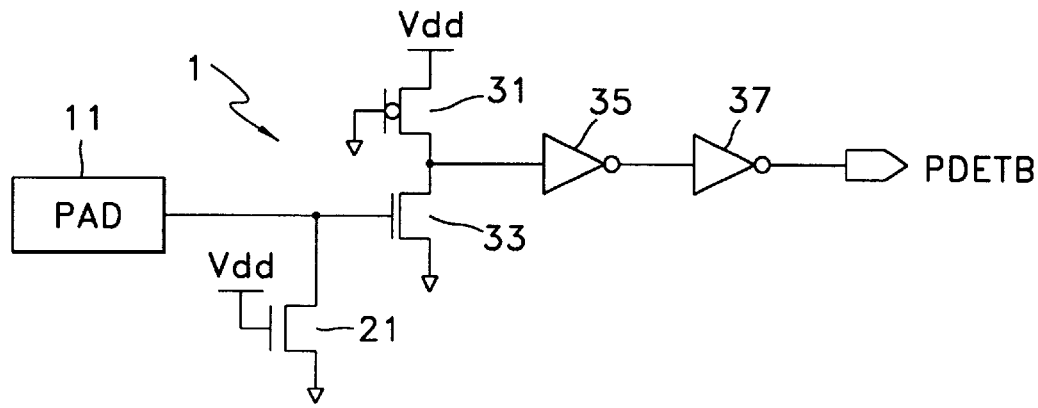
FIG. 3 is a circuit diagram of a pad signal detecting circuit in a semiconductor device according to an embodiment of the present invention.

FIG. 3 is an embodiment of the invention which is particularly useful for detecting Vref levels typically present in SSTL and T-LVTTL interfaces. The circuit of FIG. 3 is comprised of a pad 11, a PMOS transistor 31, a first NMOS transistor 33, a second NMOS transistor 21, first and second inverters 35 and 37 connected in series, which are all arranged in a semiconductor device 1. The drain of the second NMOS transistor 21 is connected to the pad 11, its gate is connected to Vdd, and its source is grounded. The gate of the first NMOS transistor 33 is connected to pad 11 and to the drain of the second NMOS transistor 21, and its source is grounded. The drain of the PMOS transistor 31 is connected to the drain of the first NMOS transistor 33, its gate is grounded, and its source is connected to Vdd. The input terminal of the first inverter 35 is connected to the drains of the PMOS transistor 31 and first NMOS transistor 33. The input terminal of the second inverter 37 is connected to the output terminal of the first inverter 35, and its output terminal generates a reference voltage detect signal PDETB which indicates that a Vref signal has been detected at the pad 11.

The pad 11 may be any type of conductive area, trace, contact, or wire on a semiconductor die, or an input pin, terminal, or contact on a semiconductor package.

If Vref at pad 11 is a voltage higher than the threshold voltage of the first NMOS transistor 33, the first NMOS transistor 33 is turned on. Then, the input terminal of the first inverter 35 is set to a logic low level and the output of the second inverter 37 is set to a logic low level, thus setting PDETB low or true.

In FIG. 3, the second NMOS transistor 21 serves to pull down the gate of first NMOS transistor 33 and prevent the enabling of PDETB when the pad 11 is not connected to an external device. Therefore, when there is no input to pad 11 (an open circuit), the second NMOS transistor 21 pulls pad 11 to ground and prevents the activation of the first NMOS transistor 33 by supplying a voltage of a logic low level to the gate of the first NMOS transistor 33. In FIG. 3, when either Vdd or Vref is input to pad 1, the circuitry enables the reference voltage detect signal PDETB to a logic low (true) level.

Figure 4:
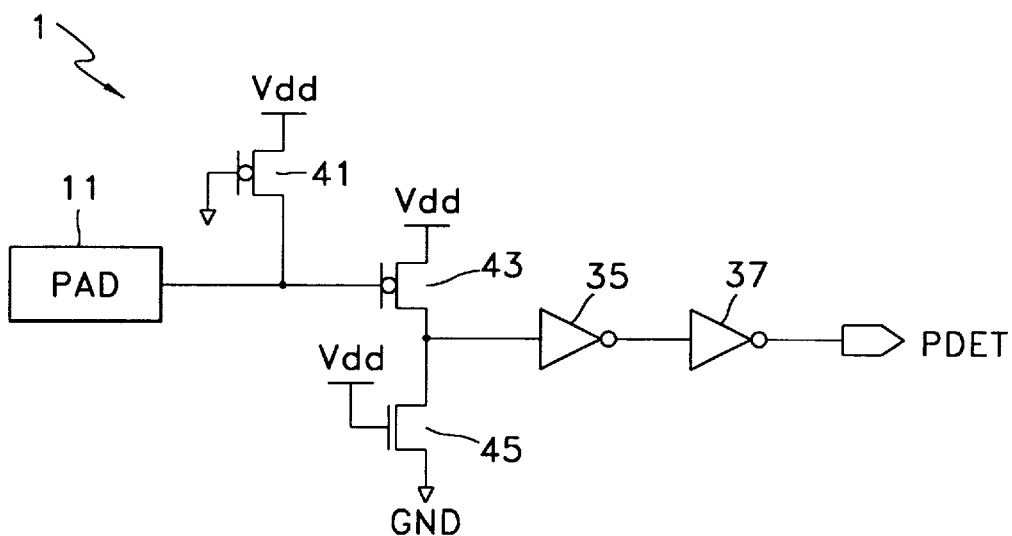
FIG. 4 is a circuit diagram of a pad signal detecting circuit in a semiconductor device according to another embodiment of the present invention.

FIG. 4 is a diagram of a pad signal detecting circuit a semiconductor device according to another embodiment of the present invention. This embodiment is particularly useful for detecting Vref levels that are typically present in GTL or HSTL interfaces. The circuit of FIG. 4 is used in the semiconductor device 1, and has first and second PMOS transistors 43 and 41, an NMOS transistor 45, and first and second inverters 35 and 37. The second PMOS transistor 41 has a source connected to Vdd, a gate connected to GND, and a drain connected to pad 1. The first PMOS transistor 43 has a gate connected to pad 11, and a source connected to Vdd. The NMOS transistor 45 has a drain connected to the drain of the first PMOS transistor 43, a gate connected to Vdd, and a source connected to GND. The drain of the first PMOS transistor 43 is connected to an input terminal of the first inverter 35. The second inverter 37 has an input connected to an output terminal of the first inverter 35, and it generates the reference voltage detect signal PDET.

The operation of the circuit of FIG. 4 is described below. In a standby state, pad 11 is an open circuit and none of Vdd, Vss, or Vref are input to pad 11. Second PMOS transistor 41 is a long channel transistor which pulls up the gate of first PMOS transistor 43 to Vdd, preventing it from being activated. If Vref is input to the pad 11, the first PMOS transistor 43 is activated. Then, the input terminal of the first inverter 35 becomes a logic high level, and the input terminal of the second inverter 37 becomes a logic low level. Therefore, PDET is logic high and enabled, indicating an input of Vref to the pad. 11. If Vdd is input to the pad 11, the first PMOS transistor 43 is kept off, and thus PDET is logic low and disabled. The second PMOS transistor 41 and the NMOS transistor 45 should be larger than the first PMOS transistor 43 to insure the proper operation of the circuit with inputs to pad 11 of Vdd, Vss and Vref. In FIGS. 3 and 4 the pull-up and pull-down functions may be performed by the long channel transistors shown in the drawings, or by resistors or other resistive elements.

As described above, the present invention detects a Vref signal, thereby allowing the semiconductor device to detect when interfaces using Vref are connected to a semiconductor device. This invention may be used in many types of interfaces which require Vref for operation, such as SSTL, T-LVTTL, GTL, HSTL, and others.

The present invention is not limited to the above embodiments, and it is understood by one of ordinary skill in the art that many variations are possible within the scope of the present invention as defined in the following claims.

What is claimed is:

1. A pad signal detecting circuit in a semiconductor device, comprising:
    a first NMOS transistor having a gate coupled directly to a pad which receives an input signal, a source connected to ground, and a drain connected through a first resistance element to a power supply voltage;
    a second resistance element connected between the gate of the first NMOS transistor and ground; and
    a logic gate having an input connected to the drain of the first NMOS transistor and an output, wherein the logic gate generates a reference voltage detect signal when the first NMOS transistor is activated in response to the input signal having a voltage of approximately a reference voltage or greater.

2. A pad signal detecting circuit as in claim 1, wherein the first and second resistance elements comprise resistors.

3. A pad signal detecting circuit as in claim 1, wherein:
    the first resistance element comprises a PMOS transistor having a drain connected to the drain of the first NMOS transistor, a gate connected to ground, and a source connected to the power supply voltage; and
    the second resistance element comprises a second NMOS transistor having a drain connected to the gate of the first NMOS transistor, a gate connected to the power supply voltage, and a source connected to ground.

4. A pad signal detecting circuit as in claim 3, wherein the PMOS transistor and the second NMOS transistor are long channel transistors.

5. A pad signal detecting circuit as in claim 4, wherein:
    the logic gate comprises a first inverter having an input connected to the drain of the first NMOS transistor, and an output connected to an input of a second inverter, wherein the second inverter has an output which generates the reference voltage detect signal.

6. A pad signal detecting circuit as in claim 4, wherein the second NMOS transistor has a higher threshold voltage than the first NMOS transistor.

7. A pad signal detecting circuit as in claim 6, wherein the reference voltage is approximately 0.45 times the power supply voltage.

8. A pad signal detecting circuit as in claim 7, wherein the reference voltage is approximately 1.5 volts.

9. A pad signal detecting circuit in a semiconductor device, comprising:
    a first PMOS transistor having a gate coupled directly to a pad which receives an input signal, a source connected to a power supply voltage, and a drain connected through a first resistance element to ground;

a second resistance element connected between the gate of the first PMOS transistor and the power supply voltage; and a logic gate having an input connected to the drain of the first PMOS transistor and an output, wherein the logic gate generates a reference voltage detect signal when the first PMOS transistor is activated in response to the input signal having a voltage of approximately a reference voltage or greater.

10. A pad signal detecting circuit as in claim 9, wherein the first and second resistance elements comprise resistors.

11. A pad signal detecting circuit as in claim 9, wherein:

the first resistance element comprises an NMOS transistor having a drain connected to the drain of the first PMOS transistor, a gate connected to the power supply voltage, and a source connected to ground; and the second resistance element comprises a second PMOS transistor having a drain connected to the gate of the first PMOS transistor, a gate connected to ground, and a source connected to the power supply voltage.

12. A pad signal detecting circuit as in claim 11, wherein the second PMOS transistor and the NMOS transistor are long channel transistors.

13. A pad signal detecting circuit as in claim 12, wherein:

the logic gate comprises a first inverter having an input connected to the drain of the first PMOS transistor, and an output connected to an input of a second inverter, wherein the second inverter has an output which generates the reference voltage detect signal.

14. A pad signal detecting circuit as in claim 12, wherein the second PMOS transistor has a higher threshold voltage than the first PMOS transistor.

15. A pad signal detecting circuit as in claim 14, wherein the reference voltage is approximately 0.75 volts.

16. A pad signal detecting circuit as in claim 14, wherein the reference voltage is approximately 0.8 volts.

17. A pad signal detecting circuit in a semiconductor device, comprising:

a first NMOS transistor having a gate coupled directly to an external pad which receives an input signal, a source connected to ground, and a drain connected through a first resistance element to a power supply voltage;

a second resistance element connected between the gate of the first NMOS transistor and ground; and a logic gate having an input connected to the drain of the first NMOS transistor and an output, wherein the logic gate generates a reference voltage detect signal when the first NMOS transistor is activated in response to the input signal having a voltage of approximately a reference voltage or greater.

18. A pad signal detecting circuit as in claim 17, wherein the first and second resistance elements comprise resistors.

19. A pad signal detecting circuit as in claim 17, wherein:

the first resistance element comprises a PMOS transistor having a drain connected to the drain of the first NMOS transistor, a gate connected to ground, and a source connected to the power supply voltage; and the second resistance element comprises a second NMOS transistor having a drain connected to the gate of the first NMOS transistor, a gate connected to the power supply voltage, and a source connected to ground.

20. A pad signal detecting circuit as in claim 19, wherein the PMOS transistor and the second NMOS transistor are long channel transistors.

21. A pad signal detecting circuit as in claim 20, wherein:

the logic gate comprises a first inverter having an input connected to the drain of the first NMOS transistor, and an output connected to an input of a second inverter, wherein the second inverter has an output which generates the reference voltage detect signal.

22. A pad signal detecting circuit as in claim 20, wherein the second NMOS transistor has a higher threshold voltage than the first NMOS transistor.

23. A pad signal detecting circuit as in claim 22, wherein the reference voltage is approximately 0.45 times the power supply voltage.

24. A pad signal detecting circuit as in claim 23, wherein the reference voltage is approximately 1.5 volts.

25. A pad signal detecting circuit in a semiconductor device, comprising:

a first PMOS transistor having a gate coupled directly to an external pad which receives an input signal, a source connected to a power supply voltage, and a drain connected through a first resistance element to ground;

a second resistance element connected between the gate of the first PMOS transistor and the power supply voltage; and a logic gate having an input connected to the drain of the first PMOS transistor and an output, wherein the logic gate generates a reference voltage detect signal when the first PMOS transistor is activated in response to the input signal having a voltage of approximately a reference voltage or greater.

26. A pad signal detecting circuit as in claim 25, wherein the first and second resistance elements comprise resistors.

27. A pad signal detecting circuit as in claim 25, wherein:

the first resistance element comprises an NMOS transistor having a drain connected to the drain of the first PMOS transistor, a gate connected to the power supply voltage, and a source connected to ground; and the second resistance element comprises a second PMOS transistor having a drain connected to the gate of the first PMOS transistor, a gate connected to ground, and a source connected to the power supply voltage.

28. A pad signal detecting circuit as in claim 27, wherein the second PMOS transistor and the NMOS transistor are long channel transistors.

29. A pad signal detecting circuit as in claim 28, wherein:

the logic gate comprises a first inverter having an input connected to the drain of the first PMOS transistor, and an output connected to an input of a second inverter, wherein the second inverter has an output which generates the reference voltage detect signal.

30. A pad signal detecting circuit as in claim 28, wherein the second PMOS transistor has a higher threshold voltage than the first PMOS transistor.

31. A pad signal detecting circuit as in claim 30, wherein the reference voltage is approximately 0.75 volts.

32. A pad signal detecting circuit as in claim 30, wherein the reference voltage is approximately 0.8 volts.

* * * * *